(12) United States Patent
Kurata et al.

(10) Patent No.: US 8,853,716 B2
(45) Date of Patent: Oct. 7, 2014

(54) ORGANIC EL PANEL, DISPLAY DEVICE USING SAME, AND METHOD FOR PRODUCING ORGANIC EL PANEL

(75) Inventors: Keiko Kurata, Hyogo (JP); Noriyuki Matsusue, Osaka (JP); Kazuhiro Yoneda, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/819,062

(22) PCT Filed: Nov. 24, 2010

(86) PCT No.: PCT/JP2010/006861
§ 371 (c)(1),
(2), (4) Date: Mar. 21, 2013

(87) PCT Pub. No.: WO2012/070087
PCT Pub. Date: May 31, 2012

(65) Prior Publication Data
US 2013/0193427 A1    Aug. 1, 2013

(51) Int. Cl.
*H01L 51/56*    (2006.01)
*H01L 51/52*    (2006.01)
*H01L 27/32*    (2006.01)

(52) U.S. Cl.
CPC ........ *H01L 51/5203* (2013.01); *H01L 2251/558* (2013.01); *H01L 2251/5315* (2013.01); *H01L 51/5265* (2013.01); *H01L 27/3211* (2013.01); *H01L 51/56* (2013.01); *H01L 27/322* (2013.01)
USPC .............................................. 257/89; 257/40

(58) Field of Classification Search
CPC .............. H01L 27/322; H01L 27/3211; H01L 27/3206; H01L 27/3216; H01L 27/3218; H01L 51/5036; H01L 51/5012; H01L 51/56; H01L 51/5016; H01L 51/0036; H01L 51/50; H01L 51/5203; H01L 51/52

USPC ................................... 257/40, 98, 89, 301.16
See application file for complete search history.

(56) References Cited

U.S. PATENT DOCUMENTS 5,443,922 A    8/1995    Nishizaki et al.
6,541,130 B2    4/2003    Fukuda
(Continued)

FOREIGN PATENT DOCUMENTS

EP    1862524 A1 *    12/2007
JP    4-137485    5/1992
(Continued)

OTHER PUBLICATIONS

U.S. Appl. No. 13/488,987 to Keiko Kurata et al., filed Jun. 5, 2012.
(Continued)

*Primary Examiner* — Whitney T Moore
(74) *Attorney, Agent, or Firm* — Greenblum & Bernstein, P.L.C.

(57) ABSTRACT

To increase light-extraction efficiency and simplify manufacturing process. An organic EL panel includes: first electrode reflecting incident light; second electrode transmitting incident light therethrough; organic light-emitting layer emitting light of corresponding color among R, G, and B colors; first functional layer including charge injection/transport layer and at least one other layer, and disposed between the first electrode and the light-emitting layer; and second functional layer disposed between the second electrode and the light-emitting layer. The charge injection/transport layers of R and G colors are equal in film thickness, and differ in film thickness from the charge injection/transport layer of the B color, the at least one other layers of R, G, and B colors are equal in film thickness, the second functional layers of R, G, and B colors are equal in film thickness, and the light-emitting layers of R, G, and B colors differ in film thickness.

15 Claims, 12 Drawing Sheets

(56) References Cited

U.S. PATENT DOCUMENTS

| | | |
|---|---|---|
| 6,737,800 B1 | 5/2004 | Winters et al. |
| 7,132,789 B2 | 11/2006 | Kobayashi |
| 7,259,514 B2 | 8/2007 | Murayama et al. |
| 7,431,997 B2 | 10/2008 | Hwang et al. |
| 7,518,141 B2 | 4/2009 | Nakamura |
| 7,601,988 B2 | 10/2009 | Seo et al. |
| 7,605,535 B2 | 10/2009 | Kobayashi |
| 7,737,627 B2 | 6/2010 | Hwang et al. |
| 7,741,770 B2 | 6/2010 | Cok et al. |
| 7,851,989 B2 | 12/2010 | Noda |
| 7,872,256 B2 | 1/2011 | Sung et al. |
| 7,875,893 B2 | 1/2011 | Seo et al. |
| 7,960,908 B2 | 6/2011 | Okutani et al. |
| 7,973,319 B2 | 7/2011 | Kashiwabara et al. |
| 8,008,852 B2 | 8/2011 | Aratani et al. |
| 8,021,764 B2 | 9/2011 | Hwang et al. |
| 8,021,765 B2 | 9/2011 | Hwang et al. |
| 8,076,687 B2 | 12/2011 | Kobayashi et al. |
| 8,188,315 B2 | 5/2012 | Hwang et al. |
| 8,188,491 B2 | 5/2012 | Seo et al. |
| 8,203,158 B2 | 6/2012 | Yoshida et al. |
| 2003/0044639 A1 | 3/2003 | Fukuda |
| 2005/0099118 A1 | 5/2005 | Kobayashi |
| 2005/0221124 A1 | 10/2005 | Hwang et al. |
| 2005/0285508 A1 | 12/2005 | Murayama et al. |
| 2006/0020136 A1 | 1/2006 | Hwang et al. |
| 2006/0108919 A1 | 5/2006 | Kobayashi |
| 2006/0115680 A1 | 6/2006 | Hwang et al. |
| 2006/0121313 A1 | 6/2006 | Lee et al. |
| 2006/0232203 A1 | 10/2006 | Noda |
| 2007/0013282 A1 | 1/2007 | Okutani et al. |
| 2007/0057264 A1 | 3/2007 | Matsuda |
| 2007/0102737 A1 | 5/2007 | Kashiwabara et al. |
| 2007/0131948 A1 | 6/2007 | Seo et al. |
| 2007/0231503 A1 | 10/2007 | Hwang et al. |
| 2008/0030129 A1 | 2/2008 | Aratani et al. |
| 2008/0107919 A1 | 5/2008 | Hwang et al. |
| 2008/0258609 A1 | 10/2008 | Nakamura |
| 2009/0081480 A1 | 3/2009 | Takeda et al. |
| 2009/0091238 A1 | 4/2009 | Cok et al. |
| 2009/0278450 A1 | 11/2009 | Sonoyama et al. |
| 2009/0283786 A1 | 11/2009 | Kobayashi et al. |
| 2010/0006872 A1 | 1/2010 | Seo et al. |
| 2010/0231484 A1 | 9/2010 | Cok et al. |
| 2011/0108864 A1 | 5/2011 | Seo et al. |
| 2011/0140101 A1 | 6/2011 | Noda |
| 2011/0241038 A1 | 10/2011 | Kashiwabara et al. |
| 2011/0316414 A1 | 12/2011 | Nendai |
| 2012/0025224 A1 | 2/2012 | Yuasa |
| 2012/0104423 A1 | 5/2012 | Kurata et al. |
| 2012/0126272 A1 | 5/2012 | Kurata et al. |
| 2012/0205688 A1 | 8/2012 | Seo et al. |
| 2012/0211733 A1 | 8/2012 | Hwang et al. |
| 2012/0241780 A1 | 9/2012 | Kurata et al. |

FOREIGN PATENT DOCUMENTS

| | | |
|---|---|---|
| JP | 4-328294 | 11/1992 |
| JP | 5-163488 | 6/1993 |
| JP | 2000-323277 | 11/2000 |
| JP | 2004-014360 | 1/2004 |
| JP | 2004-253389 | 9/2004 |
| JP | 2005-100946 | 4/2005 |
| JP | 2005-116516 | 4/2005 |
| JP | 2005-209421 | 8/2005 |
| JP | 2005-317255 | 11/2005 |
| JP | 2005-322435 | 11/2005 |
| JP | 2006-012579 | 1/2006 |
| JP | 2006-156344 | 6/2006 |
| JP | 2006-173089 | 6/2006 |
| JP | 2006-179780 | 7/2006 |
| JP | 2006-303463 | 11/2006 |
| JP | 2007-027042 | 2/2007 |
| JP | 2007-157732 | 6/2007 |
| JP | 2007-280677 | 10/2007 |
| JP | 2007-318101 | 12/2007 |
| JP | 2008-041925 | 2/2008 |
| JP | 4046948 | 2/2008 |
| JP | 2009-272150 | 11/2009 |
| JP | 2009-277507 | 11/2009 |
| JP | 2010-067482 | 3/2010 |
| JP | 2010-118163 | 5/2010 |
| JP | 2010-251156 | 11/2010 |
| WO | 2009/048520 | 4/2009 |
| WO | 2011/083515 | 7/2011 |

OTHER PUBLICATIONS

U.S. Appl. No. 13/819,059 to Keiko Kurata et al., filed Feb. 26, 2013.
U.S. Appl. No. 13/819,066 to Keiko Kurata et al., filed Feb. 26, 2013.
U.S. Appl. No. 13/818,797 to Keiko Kurata et al., filed Feb. 25, 2013.
International Search Report and Written Opinion in PCT/JP2010/000087, dated Feb. 2, 2010.
International Search Report and Written Opinion in PCT/JP2010/006862, dated Jan. 11, 2011, corrected version.
International Search Report and Written Opinion in PCT/JP2010/006859, dated Jan. 11, 2011.
International Search Report and Written Opinion in PCT/JP2010/006861, dated Jan. 11, 2011.
International Search Report and Written Opinion in PCT/JP2010/006860, dated Jan. 11, 2011.
International Preliminary Report on Patentability in PCT/JP2010/000087, dated Dec. 5, 2011.
Office Action in U.S. Appl. No. 13/819,066, dated May 6, 2014.
Office Action in U.S. Appl. No. 13/819,059, dated Apr. 11, 2014.
Advisory Action in U.S. Appl. No. 13/488,987, dated May 12, 2014.
International Preliminary Report on Patentability in PCT/JP2010/006862, dated Oct. 18, 2012, together with an English language translation thereof.
International Preliminary Report on Patentability in PCT/JP2010/006859, dated Oct. 17, 2012, together with an English language translation thereof.
International Preliminary Report on Patentability in PCT/JP2010/006861, dated Oct. 22, 2012, together with an English language translation thereof.
International Preliminary Report on Patentability in PCT/JP2010/006860, dated Oct. 17, 2012, together with an English language translation thereof.
Office Action in U.S. Appl. No. 13/818,797, dated Apr. 14, 2014.
Office Action in U.S. Appl. No. 13/488,987, dated Jan. 16, 2014.
Office Action in U.S. Appl. No. 13/819,066, dated Jan. 10, 2014.

* cited by examiner

FIG. 6A

Example 1

| | | R | G | B |
|---|---|---|---|---|
| Film thickness (nm) | Electron transport layer | 30 | 30 | 30 |
| | Light-emitting layer | 100 | 80 | 30 |
| | Hole transport layer | 50 | 50 | 20 |
| | Hole injection layer | 40 | 40 | 40 |
| | Transparent conductive layer | 100 | 100 | 100 |
| | | 190 | 190 | 160 |
| Design margin | Efficiency (cd/A) | 1.8 | 4.6 | 0.40 |
| | Chromaticity (x, y) | 0.66, 0.34 | 0.28, 0.68 | 0.13, 0.06 |
| | Tolerable limits | −10 to +10 nm | −10 to +10 nm | −15 to +9 nm |
| | Tolerable margin width | 20 nm (11%) | 20 nm (11%) | 24 nm (15%) |

FIG. 6B

Comparative example 1

| | | R | G | B |
|---|---|---|---|---|
| Film thickness (nm) | Electron transport layer | 30 | 30 | 30 |
| | Light-emitting layer | 80 | 80 | 60 |
| | Hole transport layer | 20 | 20 | 20 |
| | Hole injection layer | 40 | 40 | 40 |
| | Transparent conductive layer | 140 | 120 | 90 |
| | | 200 | 180 | 150 |
| Design margin | Efficiency (cd/A) | 1.8 | 4.4 | 0.40 |
| | Chromaticity (x, y) | 0.66, 0.34 | 0.28, 0.68 | 0.13, 0.06 |
| | Tolerable limits | −10 to +10 nm | −6 to +15 nm | −15 to +9 nm |
| | Tolerable margin width | 20 nm (10%) | 21 nm (12%) | 24 nm (16%) |

FIG. 7

| Efficiency variation in panel (%) | 20 |
|---|---|
| Chromaticity variation in panel | $\Delta x < 0.04$  $\Delta y < 0.04$ |
| Brightness | $\geq 90\%$ @30°<br>$\geq 80\%$ @45° |
| Brightness and chromaticity | $\Delta x < 0.04$ @50°<br>$\Delta y < 0.04$ @50° |

FIG. 8A

| Example 1 Red | | Min | Ave | Max |
|---|---|---|---|---|
| Film thickness (nm) | Electron transport layer | 27 | 30 | 33 |
| | Light-emitting layer | 90 | 100 | 110 |
| | Hole transport layer | 45 | 50 | 55 |
| | Hole injection layer | 36 | 40 | 44 |
| | Transparent conductive layer | 90 | 100 | 110 |
| | | 171 | 190 | 209 |

FIG. 8B

| Example 1 Green | | Min | Ave | Max |
|---|---|---|---|---|
| Film thickness (nm) | Electron transport layer | 27 | 30 | 33 |
| | Light-emitting layer | 72 | 80 | 88 |
| | Hole transport layer | 45 | 50 | 55 |
| | Hole injection layer | 36 | 40 | 44 |
| | Transparent conductive layer | 90 | 100 | 110 |
| | | 171 | 190 | 209 |

FIG. 8C

| Example 1 Blue | | Min | Ave | Max |
|---|---|---|---|---|
| Film thickness (nm) | Electron transport layer | 27 | 30 | 33 |
| | Light-emitting layer | 27 | 30 | 33 |
| | Hole transport layer | 18 | 20 | 22 |
| | Hole injection layer | 36 | 40 | 44 |
| | Transparent conductive layer | 90 | 100 | 110 |
| | | 144 | 160 | 176 |

ORGANIC EL PANEL, DISPLAY DEVICE USING SAME, AND METHOD FOR PRODUCING ORGANIC EL PANEL

TECHNICAL FIELD

The present invention relates to an organic EL panel that relies on electroluminescence phenomenon of organic materials, a display device with the organic EL panel, and a method of manufacturing the organic EL panel. The present invention particularly relates to optical design for increasing light-extraction efficiency of each of R (Red), G (Green), and B (Blue) colors.

BACKGROUND ART

In recent years, there has been proposed adoption of organic EL (Electro Luminescence) panels that rely on electroluminescence phenomenon of organic materials as display panels for display devices such as digital televisions. A matrix of respective organic EL elements of the R, G, and B colors is arranged in a substrate of an organic EL panel.

It is important to increase light-extraction efficiency of the respective organic EL elements of the R, G, and B colors, from the standpoint of reducing power consumption, increasing service life of the organic EL panels, and the like. To this end, there has been proposed a number of arts for increasing light-extraction efficiency owing to creativity of optical design of the organic EL elements (see Patent Literatures 1 to 7). For example, Patent Literature 7 discloses that respective light-emitting elements of the R, G, and B colors are each constituted from a lower electrode (mirror), a transparent conductive layer, a hole transport layer, a light-emitting layer, an electron transport layer, and an upper electrode (half mirror) that are layered, and the optical distance between the mirror and the half mirror is adjusted in order to exhibit a local maximum of light-extraction efficiency of each of the R, G, and B colors (paragraph 0012). According to Patent Literature 7, the optical distance is adjusted by adjusting the film thickness of the transparent conductive layer for each of the R, G, and B colors.

CITATION LIST

Patent Literature

[Patent Literature 1] Japanese Patent Application Publication No. 2006-156344
[Patent Literature 2] Japanese Patent Application Publication No. 2005-317255
[Patent Literature 3] Japanese Patent Application Publication No. 2005-322435
[Patent Literature 4] Japanese Patent Application Publication No. 2005-100946
[Patent Literature 5] Japanese Patent Application Publication No. 2008-41925
[Patent Literature 6] Japanese Patent Application Publication No. 2006-179780
[Patent Literature 7] Japanese Patent Application Publication No. 2005-116516

SUMMARY OF INVENTION

Technical Problem

According to the above conventional art, however, the film thickness of the transparent conductive layer needs to be adjusted for each of the R, G, and B colors, and this complicates the manufacturing process.

In view of the above problem, the present invention aims to provide an organic EL panel, a display device with use of the organic EL panel, and a method of manufacturing the organic EL panel according to which light-extraction efficiency is increased due to light interference phenomenon, and the manufacturing process is simplified compared with conventional arts.

Solution to Problem

One aspect of the present invention provides an organic EL panel comprising: a first electrode of each of R (red), G (green), and B (blue) colors that reflects incident light; a second electrode that faces the first electrode of each of the R, G, and B colors, and transmits incident light therethrough; an organic light-emitting layer of each of the R, G, and B colors that is disposed between the first electrode of a corresponding color and the second electrode, and emits light of a corresponding color due to voltage application between the first electrode of the corresponding color and the second electrode; a first functional layer of each of the R, G, and B colors that includes a charge injection/transport layer and at least one other layer, and is disposed between the first electrode of a corresponding color and the organic light-emitting layer of a corresponding color; and a second functional layer of each of the R, G, and B colors that is disposed between the second electrode and the organic light-emitting layer of a corresponding color, wherein a first portion of light of each of the R, G, and B colors emitted from the organic light-emitting layer of a corresponding color travels through the first functional layer of a corresponding color towards the first electrode of a corresponding color, strikes and is reflected by the first electrode of the corresponding color, and then is emitted externally after passing through the first functional layer of the corresponding color, the organic light-emitting layer of the corresponding color, the second functional layer of a corresponding color and the second electrode, a second portion of the light of each of the R, G, and B colors travels through the second functional layer of the corresponding color towards the second electrode instead of towards the first electrode of the corresponding color, and is emitted externally after passing through the second electrode, the respective charge injection/transport layers of the R and G colors are equal in film thickness to each other, and differ in film thickness from the charge injection/transport layer of the B color, the respective at least one other layers of the R, G, and B colors are equal in film thickness to one another, the respective second functional layers of the R, G, and B colors are equal in film thickness to one another, and the respective organic light-emitting layers of the R, G, and B colors differ in film thickness from one another.

Advantageous Effects of Invention

Generally, the organic light-emitting layer needs to be formed separately for each of the R, G, and B colors irrespective of whether having the same film thickness among the R, G, and B colors, because of being formed from a different material for each of the R, G, and B colors. Compared with this, the first functional layer and the second functional layer are each formed from the same material among the R, G, and B colors. Accordingly, if differing in film thickness among the R, G, and B colors, the first functional layer and the second functional layer each need to be formed separately for each of the R, G, and B colors. Otherwise, the first functional layer and the second functional layer each do not need to be formed separately for each of the R, G, and B colors. In order to make a layer to differ in film thickness for each of the R, G, and B colors, a printing method such as the inkjet method facilitates film formation for each of the R, G, and B colors. Note that, depending on the type of layer, there is a case where the printing method is unavailable for film formation, a case where though the printing method is available for film formation, other film formation method is more appropriate for exhibiting desired characteristics, or the like. Accordingly, film formation cannot be always made by a film formation method according to which film formation for each of the R, G, and B colors is easily made.

According to the organic EL panel that is the one aspect of the present invention, the organic light-emitting layer and the hole injection/transport layer are each formed separately to have a film thickness for each of the R, G, and B colors. In this way, film formation is made separately to obtain a film thickness for each of the R, G, and B colors, and accordingly it is possible to take advantage of light interference phenomenon. Also, since the organic light-emitting layer originally needs to be formed separately to have a film thickness for each of the R, G, and B colors, there is no increase in the number of manufacturing processes due to separate formation of the organic light-emitting layer to have a film thickness for each of the R, G, and B colors. The hole injection/transport layer is appropriate for formation by the printing method, and accordingly is easily formed separately to have a film thickness for each of the R, G, and B colors. As a result, it is possible to increase light-extraction efficiency taking advantage of light interference phenomenon, and simplify the manufacturing process compared with conventional arts.

BRIEF DESCRIPTION OF DRAWINGS

FIG. 4A shows the case where no CF is used in Example 1, FIG. 4B shows the case where CFs are used in Example 1, FIG. 4C shows the case where no CF is used in Comparative example 1, and FIG. 4D shows the case where CFs are used in Comparative example 1.

FIG. 5A and FIG. 5B show variation of light-extraction efficiency when varying the film thickness of a hole transport layer, in the case where no CF is used and the case where CFs are used, respectively, and FIG. 5C and FIG. 5D show variation of light-extraction efficiency when varying the film thickness of an organic light-emitting layer, in the case where no CF is used and the case where CFs are used, respectively.

FIG. 6A and FIG. 6B show light-extraction efficiency and so on when each layer constituting an organic EL element is set to have an optimal film thickness in Example 1 and Comparative example 1, respectively.

FIG. 7 show allowable ranges.

FIG. 8A to FIG. 8C each show the minimum value, the average value, and the maximum value of the film thickness of each layer constituting the organic EL element in Example 1, with respect to the R, G, and B colors, respectively.

DESCRIPTION OF EMBODIMENT

[Process by which Aspect of the Present Invention was Achieved]

Before concretely describing one aspect of the present invention, the following describes the process by which the aspect of the present invention was achieved.

The present inventors have been made researches and developments on an organic EL panel. This organic EL panel is constituted from a first electrode, a first functional layer, an organic light-emitting layer, a second functional layer, and a second electrode that are layered, and has specifications in which the first electrode reflects light and the second electrode transmits the light therethrough. According to such specifications, a distance between the first electrode and the organic light-emitting layer, that is, the film thickness of the first functional layer strongly influences light interference phenomenon. For this reason, it is considered that, in order to increase light-extraction efficiency for each of the R, G, and B colors, the film thickness of the first functional layer should be appropriately adjusted for each of the R, G, and B colors.

Figure 5A:
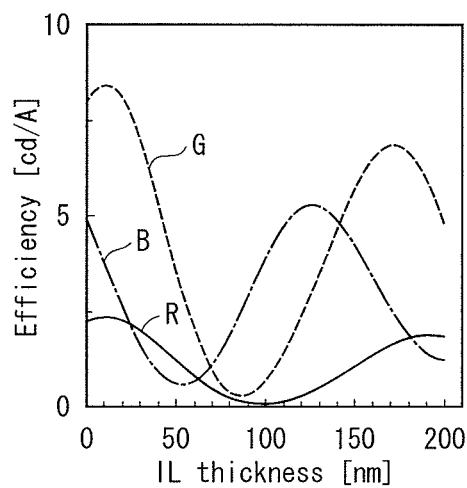
FIG. 5A to FIG. 5D each show variation of light-extraction efficiency when varying the film thickness of a layer constituting an organic EL element.
Figure 5C:
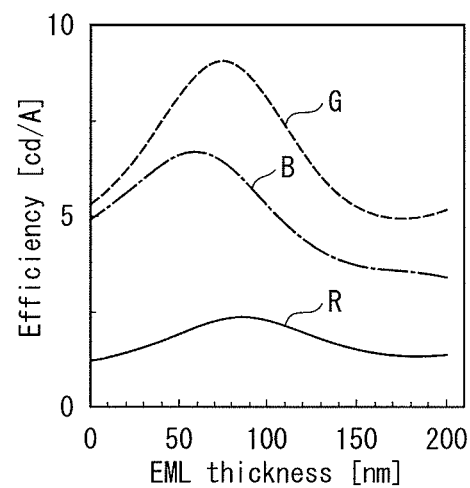
Figure 5B:
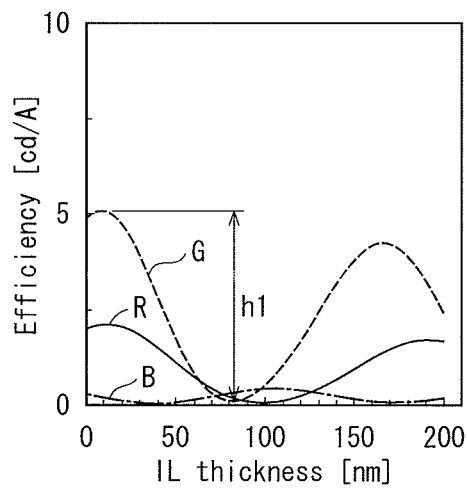
Figure 5D:
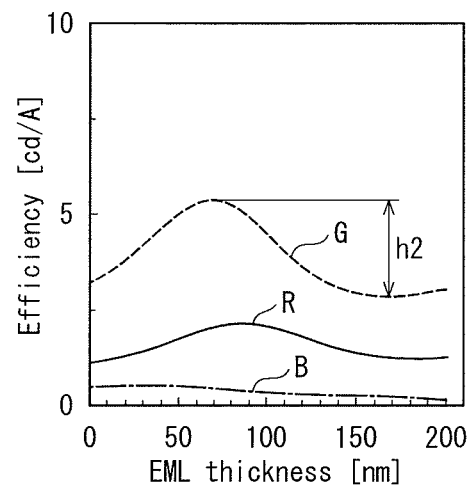

Also, the researches made by the present inventors proved that the organic EL panel having the above specifications has the structure in which the light-extraction efficiency varies also in accordance with variation of the film thickness of the organic light-emitting layer. FIG. 5A to FIG. 5D show the result of the researches. FIG. 5A and FIG. 5B show variation of light-extraction efficiency when varying the film thickness of a hole transport layer included in the first functional layer, in the case where no CF is used and the case where CFs are used, respectively. FIG. 5C and FIG. 5D show variation of light-extraction efficiency when varying the film thickness of an organic light-emitting layer, in the case where no CF is used and the case where CFs are used, respectively. According to this proof, it is clear that the light-extraction efficiency varies not only when the film thickness of the first functional layer is varied but also when the film thickness of the organic light-emitting layer is varied.

By the way, in general, the organic light-emitting layer needs to be formed separately for each of the R, G, and B colors irrespective of whether having the same film thickness among the R, G, and B colors, because of being formed from a different material for each of the R, G, and B colors. Compared with this, the first functional layer and the second functional layer are each formed from the same material among the R, G, and B colors. Accordingly, if differing in film thickness among the R, G, and B colors, the first functional layer and the second functional layer each need to be formed separately for each of the R, G, and B colors. Otherwise, the first functional layer and the second functional layer each do not need to be formed separately for each of the R, G, and B colors. In order to make a layer to differ in film thickness for each of the R, G, and B colors, a printing method such as the inkjet method facilitates film formation for each of the R, G, and B colors. Note that, depending on the type of layer, there is a case where the printing method is unavailable for film formation, a case where though the printing method is available for film formation, other film formation method is more appropriate for exhibiting desired characteristics, or the like. Accordingly, it is not always appropriate to make film formation by the printing method.

In view of the results shown in FIG. 5A to FIG. 5D and the above circumstances, the present inventors considered whether it is possible to achieve the increase in light-extraction efficiency and the simplification of the manufacturing process, only by film thickness adjustment on the organic light-emitting layer for each of the R, G, and B colors. However, the variation of light-extraction efficiency with respect to the variation of the film thickness of the organic light-emitting layer is smaller than the variation of light-extraction efficiency with respect to the variation of the film thickness of the first functional layer (see respective ranges h1 and h2 shown in FIG. 5B and FIG. 5D). This proves that it is impossible to sufficiently increase the light-extraction efficiency, especially the light-extraction efficiency of the B color, only by film thickness adjustment on the organic light-emitting layer for each of the R, G, and B colors.

The one aspect of the present invention was achieved based on the new expertise described above.

[Outline of Aspects of the Present Invention]

One aspect of the present invention provides an organic EL panel comprising: a first electrode of each of R (red), G (green), and B (blue) colors that reflects incident light; a second electrode that faces the first electrode of each of the R, G, and B colors, and transmits incident light therethrough; an organic light-emitting layer of each of the R, G, and B colors that is disposed between the first electrode of a corresponding color and the second electrode, and emits light of a corresponding color due to voltage application between the first electrode of the corresponding color and the second electrode; a first functional layer of each of the R, G, and B colors that includes a charge injection/transport layer and at least one other layer, and is disposed between the first electrode of a corresponding color and the organic light-emitting layer of a corresponding color; and a second functional layer of each of the R, G, and B colors that is disposed between the second electrode and the organic light-emitting layer of a corresponding color, wherein a first portion of light of each of the R, G, and B colors emitted from the organic light-emitting layer of a corresponding color travels through the first functional layer of a corresponding color towards the first electrode of a corresponding color, strikes and is reflected by the first electrode of the corresponding color, and then is emitted externally after passing through the first functional layer of the corresponding color, the organic light-emitting layer of the corresponding color, the second functional layer of a corresponding color and the second electrode, a second portion of the light of each of the R, G, and B colors travels through the second functional layer of the corresponding color towards the second electrode instead of towards the first electrode of the corresponding color, and is emitted externally after passing through the second electrode, the respective charge injection/transport layers of the R and G colors are equal in film thickness to each other, and differ in film thickness from the charge injection/transport layer of the B color, the respective at least one other layers of the R, G, and B colors are equal in film thickness to one another, the respective second functional layers of the R, G, and B colors are equal in film thickness to one another, and the respective organic light-emitting layers of the R, G, and B colors differ in film thickness from one another.

According to the organic EL panel that is the one aspect of the present invention, the organic light-emitting layer and the hole injection/transport layer are each formed separately to have a film thickness for each of the R, G, and B colors. In this way, film formation is made separately to obtain a film thickness for each of the R, G, and B colors, and accordingly it is possible to take advantage of light interference phenomenon. Also, since the organic light-emitting layer originally needs to be formed separately to have a film thickness for each of the R, G, and B colors, there is no increase in the number of manufacturing processes due to separate formation of the organic light-emitting layer to have a film thickness for each of the R, G, and B colors. The hole injection/transport layer is appropriate for formation by the printing method, and accordingly is easily formed separately to have a film thickness for each of the R, G, and B colors. As a result, it is possible to increase light-extraction efficiency taking advantage of light interference phenomenon, and simplify the manufacturing process compared with conventional arts.

Note that the "charge injection/transport layer" is a collective name of a hole injection layer, a hole transport layer, a hole injection and transport layer, an electron injection layer, an electron transport layer, and an electron injection and transport layer.

Also, the organic EL panel may further comprise a color filter of each of the R, G, and B colors for chromaticity correction that is disposed opposite the organic light-emitting layer of a corresponding color with the second electrode being interposed therebetween, wherein the film thickness of the organic light-emitting layer of each of the R, G, and B colors is adjusted so as to correspond to a local maximum of light-extraction efficiency with respect to the light of the corresponding color emitted externally through the color filter of the corresponding color.

The researches made by the present inventors proved that when the film thickness of each layer constituting an organic EL element is varied, both the light-extraction efficiency and the chromaticity vary, and that a chromaticity corresponding to a local maximum of light-extraction efficiency is not necessarily at the neighborhood of a target chromaticity.

The more greatly a current chromaticity differs from the target chromaticity, the more chromaticity correction needs to be made with use of a color filter (CF). As a result, there is a case where though a chromaticity before chromaticity correction corresponds to a local maximum of light-extraction efficiency, a chromaticity after the chromaticity correction does not correspond to a local maximum of light-extraction efficiency. According to the one aspect of the present invention, the film thickness of the organic light-emitting layer is set so as to correspond to a local maximum of light-extraction efficiency with respect to light after passing through a color filter. Therefore, it is possible to make the current chromaticity to approach to the target chromaticity and increase the light-extraction efficiency.

Also, a film thickness of the first functional layer of each of the R, G, and B colors may be adjusted so as to correspond to a second local maximum of the light-extraction efficiency with respect to the light of the corresponding color emitted externally through the color filter of the corresponding color.

Variation of the film thickness of the first functional layer causes cyclic variation of the light-extraction efficiency. As a result, a local maximum of light-extraction efficiency cyclically appears. Here, a local maximum that cyclically appears is referred to as the first local maximum, the second local maximum, and the third local maximum, . . . , in order of increasing corresponding film thickness of the first functional layer. When the first functional layer has a too thin film thickness, it is difficult to realize stable film formation. According to the one aspect of the present invention, the first functional layer has a film thickness such that the first functional layer is stably formed.

Also, the first functional layer of each of the R, G, and B colors may include, as the at least one other layer, a transparent conductive layer.

While it is possible to form the transparent conductive layer by the physical vapor deposition method, it is difficult to form the transparent conductive layer by the printing method. According to the one aspect of the aspect of the present invention, the respective transparent conductive layers of the R, G, and B colors have the same film thickness. This simplifies the manufacturing process.

Also, the first functional layer of each of the R, G, and B colors may include a layer formed by a printing method and a layer formed by a physical vapor deposition method, the respective layers of the R and G colors formed by the printing method may be equal in film thickness to each other, and differ in film thickness from the layer of the B color formed by the printing method, and the respective layers of the R, G, and B colors formed by the physical vapor deposition method may be equal in film thickness to one another.

This simplifies the manufacturing process of the organic EL panel.

Also, the respective organic light-emitting layers of the R, G, and B colors may have a film thickness of 90 nm to 110 nm, a film thickness of 72 nm to 88 nm, and a film thickness of 27 nm to 33 nm, respectively, the first functional layer of each of the R, G, and B colors may include, as the at least one other layer, a transparent conductive layer formed on an anode that is the first electrode of the corresponding color, the first functional layer of each of the R, G, and B colors may include, as the charge injection/transport layer, a hole injection layer formed on the transparent conductive layer and a hole transport layer formed on the hole injection layer, the respective transparent conductive layers of the R, G, and B colors each may have a film thickness of 90 nm to 110 nm, the respective hole injection layers of the R, G, and B colors each may have a film thickness of 36 nm to 44 nm, and the respective hole transport layers of the R and G colors each may have a film thickness of 45 nm to 55 nm, and the hole transport layer of the B color has a film thickness of 18 nm to 22 nm.

Also, the first electrode of each of the R, G, and B colors may be formed from aluminum or alloy of aluminum, and the transparent conductive layer of each of the R, G, and B colors may be formed from IZO (Indium Zinc Oxide).

Also, the respective second functional layers of the R, G, and B colors each may have a film thickness of 27 nm to 33 nm.

Also, the second functional layer of each of the R, G, and B colors may include an electron transport layer having a film thickness of 27 nm to 33 nm.

Also, the organic light-emitting layer of each of the R, G, and B colors may contain an organic material, and may be formed by a printing method.

Also, the first functional layer of each of the R, G, and B colors may include, as the at least one other layer, a transparent conductive layer formed on an anode that is the first electrode of the corresponding color, the first functional layer of each of the R, G, and B colors may include, as the charge injection/transport layer, a hole injection layer formed on the transparent conductive layer and a hole transport layer formed on the hole injection layer, the transparent conductive layer of each of the R, G, and B colors and the hole injection layer of each of the R, G, and B colors may be formed by a physical vapor deposition method, and the hole transport layer of each of the R, G, and B colors may be formed by a printing method.

One aspect of the present invention provides a display device with use of the above organic EL panel.

One aspect of the present invention provides A method of manufacturing an organic EL panel, comprising: a first step of preparing a first electrode of each of R (red), G (green), and B (blue) colors that reflects incident light; a second step of disposing a first functional layer of each of the R, G, and B colors including a charge injection/transport layer and at least one other layer on the first electrode of a corresponding color; a third step of disposing an organic light-emitting layer that emits light of each of the R, G, and B colors on the first functional layer of a corresponding color; a fourth step of disposing a second functional layer of each of the R, G, and B colors on the organic light-emitting layer of a corresponding color; and a fifth step of disposing a second electrode that transmits incident light therethrough on the respective second functional layers of the R, G, and B colors so as to face the respective first electrodes of the R, G, and B colors, wherein in the second step, the first functional layer is disposed such that the respective charge injection/transport layers of the R and G colors are equal in film thickness to each other, and differ in film thickness from the charge injection/transport layer of the B color, and the respective at least one other layers of the R, G, and B colors are equal in film thickness to one another, in the third step, the organic light-emitting layer is disposed such that the respective organic light-emitting layers of the R, G, and B colors differ in film thickness from one another, and in the fourth step, the second functional layer is disposed such that the respective second functional layers of the R, G, and B colors are equal in film thickness to one another.

In the present Description, the expressions "have the same film thickness", "equal in film thickness", and so on indicate not only the case where respective layers of the R, G, and B colors have the same measured value of film thickness, but also the case where the respective layers of the R, G, and B colors each have a different measured value of film thickness within a manufacturing error range of ±10%.

[Pixel Structure of Organic EL Panel]

Figure 1:
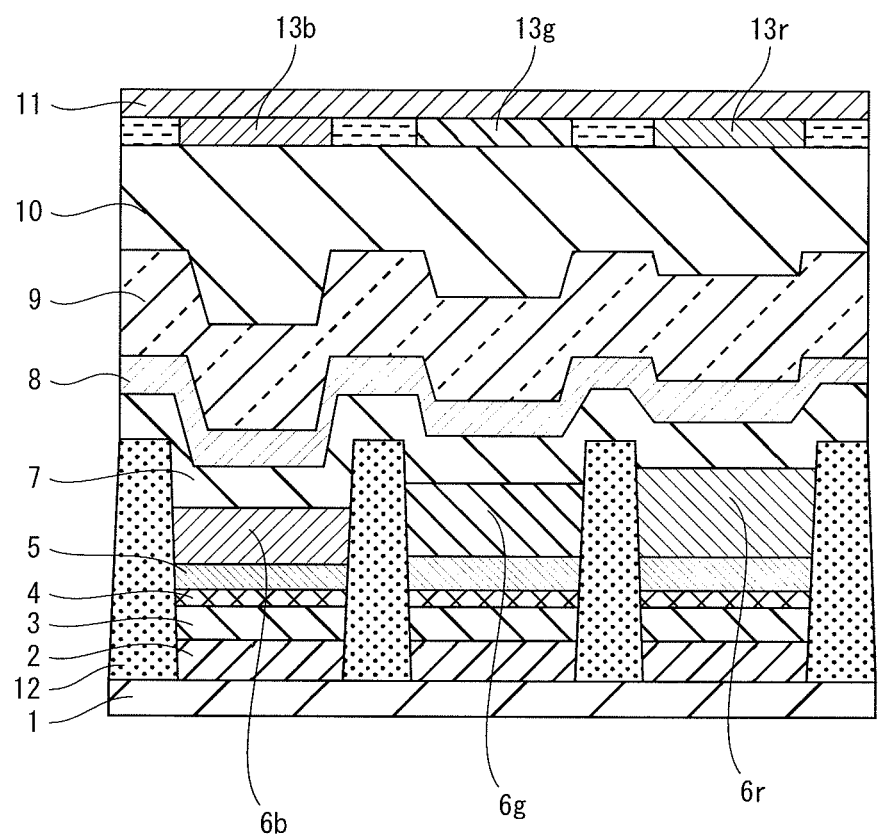
FIG. 1 is a cross-sectional diagram schematically showing the pixel structure of an organic EL panel according to an embodiment of the present invention.

FIG. 1 is a cross-sectional diagram schematically showing the pixel structure of an organic EL panel according to an embodiment of the present invention.

The organic EL panel has R, G, and B pixels arranged regularly in a matrix of rows and columns. Each pixel is formed by an organic EL element with use of an organic material.

The blue organic EL element includes a substrate 1, a reflective electrode 2, a transparent conductive layer 3, a hole injection layer 4, a hole transport layer 5, an organic light-emitting layer 6b, an electron transport layer 7, a transparent electrode 8, a thin-film passivation layer 9, a resin passivation layer 10, a substrate 11, and a CF 13b. Hereinafter, the transparent conductive layer 3, the hole injection layer 4, and the hole transport layer 5 that are disposed between the reflective electrode 2 and the organic light-emitting layer 6b are also collectively referred to as "first functional layer". Furthermore, the electron transport layer 7 that is disposed between the organic light-emitting layer 6b and the transparent electrode 8 is also referred to as "second functional layer".

The green organic EL element has the same structure as the blue organic EL element, except for an organic light-emitting layer 6g and a CF 13g. The red organic EL element also has the same structure as the blue organic EL element, except for an organic light-emitting layer 6r and a CF 13r. In this example, the substrate 1, the electron transport layer 7, the transparent electrode 8, the thin-film passivation layer 9, the resin passivation layer 10, and the substrate 11 are shared by the respective organic EL elements of the R, G, and B colors, whereas other layers are partitioned by banks 12 among the respective organic EL elements of the R, G, and B colors.

Figure 2:
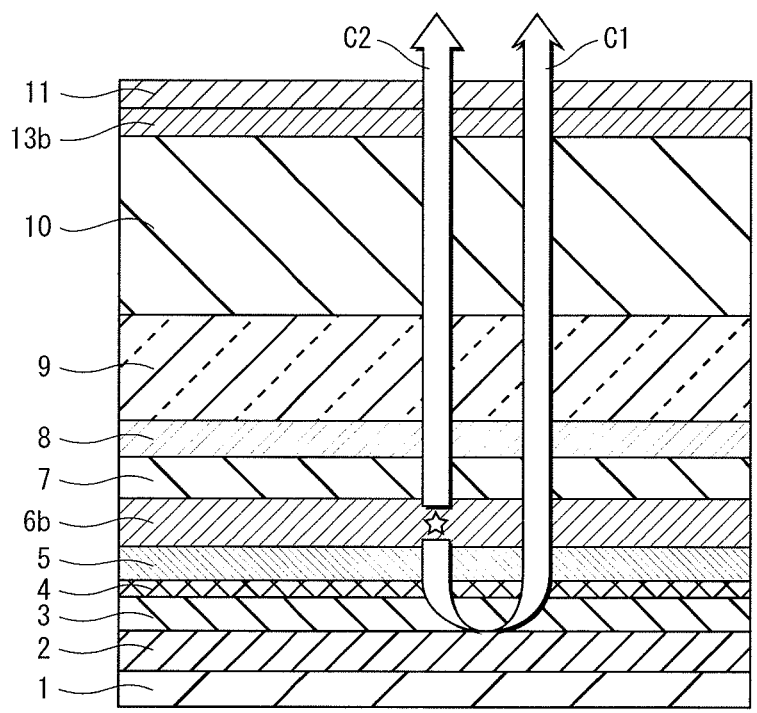
FIG. 2 shows an example of a cavity structure in a blue organic EL element.

Also, in the organic EL element of each of the R, G, and B colors, a cavity structure is realized due to light interference phenomenon by providing the corresponding reflective electrode 2. FIG. 2 shows an example of a cavity structure in the blue organic EL element. Two optical paths are formed in the blue organic EL element. One is a first optical path C1, in which a portion of light emitted from the organic light-emitting layer 6b travels through the first functional layer towards the reflective electrode 2, strikes and is reflected by the reflective electrode 2, and then is emitted externally after passing through the first functional layer, the organic light-emitting layer 6b, the second functional layer, and the transparent electrode 8. The other is a second optical path C2, in which a remaining portion of the light emitted from the organic light-emitting layer 6b travels through the second functional layer towards the transparent electrode 8 instead of towards the reflective electrode 2, and then is emitted externally after passing through the transparent electrode 8. By appropriately setting the film thickness of the first functional layer, it is possible to cause light traveling the first optical path C1 and light traveling the second optical path C2 to strengthen each other, thereby increasing light-extraction efficiency.

In the present embodiment, the respective first functional layers of the R, G, and B colors have the same structure, and are formed from the same material. Also, the respective first functional layers of the R and G colors are equal in film thickness to each other, and differ in film thickness from the first functional layer of the B color. Film thicknesses adjustment for each of the R, G, and B colors is made on the hole transport layer 5. In other words, the respective hole transport layers 5 of the R and G colors are equal in film thickness to each other, and differ in film thickness from the hole transport layer 5 of the B color. Also, the respective transparent conductive layers 3 of the R, G, and B colors are equal in film thickness to one another, and respective hole injection layers 4 of the R, G, and B colors are equal in film thickness to one another. The respective first functional layers of the R, G, and B colors have the same structure, and are formed from the same material. Accordingly, in terms of the optical distance from the reflective electrode of a corresponding color, the respective organic light-emitting layers of the R and G colors are equal to each other, and differ from the organic light-emitting layer of the B color. Note that for a single layer structure, the optical distance is the product of a film thickness and a refractive index, and for a multilayer structure with two or more layers, the optical distance is the sum of the product of the film thickness and the refractive index for each layer.

Also, the respective second functional layers of the R, G, and B colors have the same structure, are formed from the same material, and have the same film thickness. Accordingly, the respective organic light-emitting layers of the R, G, and B colors have the same optical distance from the transparent electrode.

Also, the respective light-emitting layers of the R, G, and B colors differ in material and film thickness. Specifically, the film thickness of each of the respective organic light-emitting layers of the R, G, and B colors is adjusted so as to correspond to a local maximum of light-extraction efficiency with respect to light after passing through a CF of a corresponding color.

Generally, the organic light-emitting layer needs to be formed separately for each of the R, G, and B colors irrespective of whether having the same film thickness among the R, G, and B colors, because of being formed from a different material for each of the R, G, and B colors. Compared with this, the first functional layer and the second functional layer are each formed from the same material among the R, G, and B colors. Accordingly, if differing in film thickness among the R, G, and B colors, the first functional layer and the second functional layer each need to be formed separately for each of the R, G, and B colors. Otherwise, the first functional layer and the second functional layer each do not need to be formed separately for each of the R, G, and B colors. In order to make a layer to differ in film thickness for each of the R, G, and B colors, a printing method such as the inkjet method facilitates film formation for each of the R, G, and B colors. Note that, depending on the type of layer, there is a case where the printing method is unavailable for film formation, a case where though the printing method is available for film formation, other film formation method is more appropriate for exhibiting desired characteristics, or the like. Accordingly, film formation cannot be always made by a film formation method according to which film formation for each of the R, G, and B colors is easily made.

In the present embodiment, the respective organic light-emitting layers 6r, 6g, and 6b are formed so as to each have a different film thickness. Also, the respective hole transport layers 5 of the R, G, and B colors are formed so as to each have a different film thickness. In this way, film formation is made separately to obtain a film thickness for each of the R, G, and B colors, and accordingly it is possible to take advantage of light interference phenomenon. Also, the respective organic light-emitting layers 6r, 6g, and 6b originally need to be separately formed. Accordingly, there is no increase in the number of manufacturing processes due to formation of the organic light-emitting layer to have a film thickness different for each of the R, G, and B colors. The hole transport layer 5 is appropriate for formation by the printing method, and accordingly is easily formed separately to have a film thickness for each of the R, G, and B colors. Also, the transparent conductive layer 3 and the hole injection layer 4 each have the same film thickness among the R, G, and B colors, and accordingly each do not need to be formed separately to have a film thickness for each of the R, G, and B colors. As a result, it is possible to increase light-extraction efficiency taking advantage of light interference phenomenon, and simplify the manufacturing process compared with conventional arts.

The following describes in detail the film thickness of each layer constituting an organic EL element.

[First Simulations]

The present inventors prepared Example 1 and Comparative example 1, and calculated an optimal film thickness of each layer constituting an organic EL element in Example 1 and Comparative example 1 through simulations to evaluate the light-extraction efficiency and the simplicity of the manufacturing process.

Figure 3:
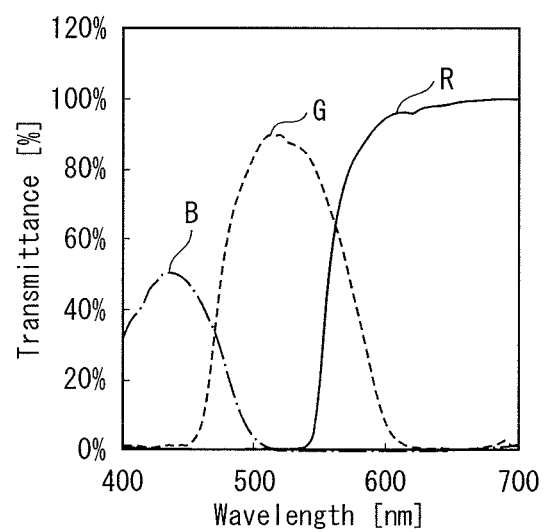
FIG. 3 shows the transmission spectrum of each of respective color filters (CFs) of the R, G, and B colors used in simulations.

In the first simulations, a reflective electrode is formed from an alloy of aluminum, a transparent conductive layer is formed from IZO (Indium Zinc Oxide), and respective organic light-emitting layers of the R, G, and B colors are formed from RP158, GP1200, and BP105 manufactured by Sumation Co., Ltd., respectively. FIG. 3 shows the transmission spectrum of each of respective CFs of the R, G, and B colors used in the first simulations. The present inventors created the characteristics of the CFs (hereinafter, "CF characteristics") used in the first simulations, by making appropriate adjustments based on a known art in view of the optical characteristics in the present embodiment. For example, the respective CF characteristics for the R and G colors are based on Japanese Patent Application Publication 2005-116516 (FIG. 5), and the CF characteristics for the B color are based on B440 by Opto-Line, Inc.

Figure 4A:
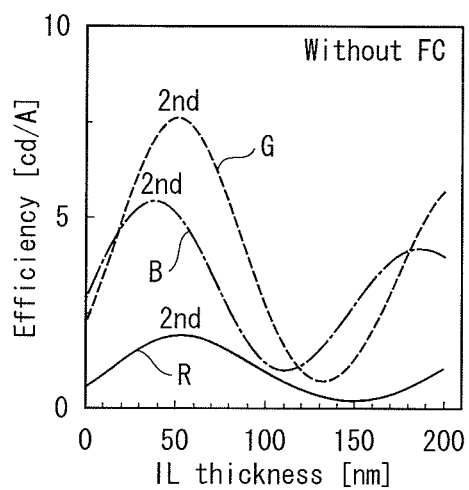
FIG. 4A to FIG. 4D show variation of light-extraction efficiency when varying the film thickness of a first functional layer.
Figure 4B:
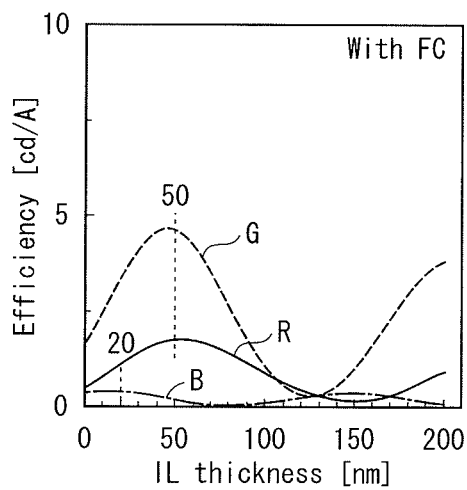
Figure 4C:
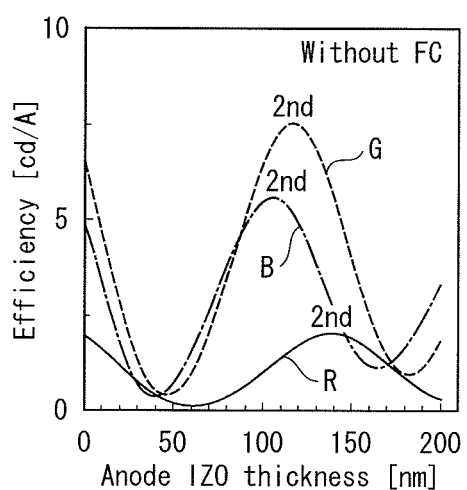
Figure 4D:
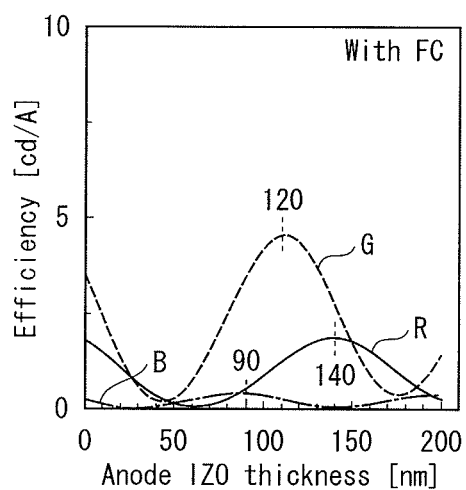

FIG. 4A to FIG. 4D show variation of light-extraction efficiency when varying the film thickness of the first functional layer, FIG. 4A shows the case where no CF is used in Example 1, FIG. 4B shows the case where CFs are used in Example 1, FIG. 4C shows the case where no CF is used in Comparative example 1, and FIG. 4D shows the case where CFs are used in Comparative example 1.

In Example 1, an electron transport layer of each of the R, G, and B colors has a fixed film thickness of 30 nm, a hole injection layer of each of the R, G, and B colors has a fixed film thickness of 40 nm, a transparent conductive layer of each of the R, G, and B colors has a fixed film thickness of 100 nm. Respective organic light-emitting layers of the R, G, and B colors have a fixed film thickness of 100 nm, a fixed film thickness of 80 nm, and a fixed film thickness of 30 nm, respectively. The film thickness of the first functional layer is varied by only variation of the film thickness of the hole transport layer.

In Comparative example 1, an electron transport layer of each of the R, G, and B colors has a fixed film thickness of 30 nm, a hole injection layer of each of the R, G, and B colors has a fixed film thickness of 40 nm, a hole transport layer of each of the R, G, and B colors has a fixed film thickness of 20 nm. Respective organic light-emitting layers of the R, G, and B colors have a fixed film thickness of 80 nm, a fixed film thickness of 80 nm, and a fixed film thickness of 60 nm, respectively. The film thickness of the first functional layer is varied by only variation of the film thickness of the transparent conductive layer.

In the case where a CF is used, the following calculations are made with respect to all the film thicknesses that are simulation targets to calculate an optimal film thickness. An arbitrary film thickness is selected, and a chromaticity corresponding to the arbitrary film thickness in the case where no CF is used is calculated. CF characteristics for approximating the calculated chromaticity to a target chromaticity are calculated. Then, light-extraction efficiency in the case where a CF having the calculated CF characteristics is calculated.

FIG. 4A and FIG. 4C demonstrate the following points (1) and (2).

Point (1): Variation of the film thickness of the first functional layer causes cyclic variation of the light-extraction efficiency. As a result, a local maximum of light-extraction efficiency cyclically appears.

Point (2): When a local maximum that cyclically appears is referred to as the first local maximum, the second local maximum, and the third local maximum, . . . , in order of increasing film thickness of the first functional layer, a local maximum with a smaller degree has a larger value. With respect to the first functional layer of the B color shown in FIG. 4A for example, while the second local maximum corresponds to a film thickness of around 40 nm, the third local maximum corresponds to a film thickness of around 180 nm. Accordingly, the second local maximum has a larger value than the third local maximum. Note that when the hole transport layer has a film thickness of 0 nm, the first functional layer has a film thickness of 140 nm. The first local maximum appears in a range of the film thickness of the first functional layer equal to or less than 140 nm, and accordingly does not appear in ranges shown in FIG. 4A.

The point (1) indicates that interference occurs between light traveling the first optical path C1 and light traveling the second optical path C2. Also, the point (2) indicates that the light-extraction efficiency is increased more by setting the film thickness of the hole transport layer so as to correspond to a local maximum with a smaller degree.

Also according to FIG. 4B, in order to increase the light-extraction efficiency in Example 1, it is optimal for the respective hole transport layers of the R, G, and B colors to have a film thickness of 50 nm, a film thickness of 50 nm, and a film thickness of 20 nm, respectively. According to FIG. 4D compared with Example 1, in order to increase the light-extraction efficiency in Comparative example 1, it is optimal for the respective transparent conductive layers of the R, G, and B colors to have a film thickness of 140 nm, a film thickness of 120 nm, and a film thickness of 90 nm, respectively. In this way, in terms of optimal film thickness for increasing the light-extraction efficiency, while the respective hole transport layers of the R and G colors are equal to each other, and differ only from the hole transport layer of the B color in Example 1, the respective transparent conductive layers of the R, G, and B colors differ from one another in Comparative example 1. The difference between Example 1 and Comparative example 1 results from the film thickness adjustment on the organic light-emitting layer. Actually, in Example 1, the film thickness of the organic light emitting layer for each of the R, G, and B colors is set such that the respective hole transport layers of the R, G, and B colors have, as much as possible, the same film thickness corresponding to the second local maximum of light-extraction efficiency of a corresponding color in the case where CFs are used. Specifically, the respective organic light-emitting layers of the R, G, and B colors have a film thickness of 100 nm, a film thickness of 80 nm, and a film thickness of 30 nm, respectively. In Comparative example 1 compared with Example 1, such a design concept was not introduced. The respective organic light-emitting layers of the R, G, and B colors are just set to have the same film thickness as much as possible, within a scope that does not affect light emission. Specifically, the respective organic light-emitting layers of the R, G, and B colors have a film thickness of 80 nm, a film thickness of 80 nm, and a film thickness of 60 nm, respectively. Due to the difference in design concept, there occurs a difference in results between Example 1 and Comparative example 1.

As shown in FIG. 4A and FIG. 4C, the film thickness corresponding to a local maximum sometimes differs between the case where no CF is used and the case where CFs are used. Specifically, with respect to the B color, in the case where no CF is used, a film thickness of 40 nm of the first functional layer corresponds to a local maximum of light-extraction efficiency. Compared with this, in the case where a CF is used, a film thickness of 20 nm or less of the first functional layer corresponds to a local maximum of light-extraction efficiency. This suggests that in the case where each layer constituting the first functional layer is designed so as to have an optimal film thickness on the assumptions that no CF is used, the use of CFs does not necessarily make each designed layer to have an optimal film thickness. In other words, in the case where the use of CFs is assumed, the film thickness of each layer needs to be considered in view of the CF characteristics. In Example 1, the results are obtained after consideration of the film thickness of each layer in view of the CF characteristics, and an optimal design is made for the case where CFs are used.

In Example 1, the respective hole transport layers of the R and G colors are equal in film thickness to each other, and differ in film thickness only from the hole transport layer of the B color. Also, the respective organic light-emitting layers of the R, G, and B colors differ in film thickness to one another. As shown below, it is often the case where the light-extraction efficiency is increased more by making film thickness adjustment on the organic light-emitting layer for each of the R, G, and B colors than by making film thickness adjustment on the hole transport layer.

FIG. 5A to FIG. 5D each show variation of light-extraction efficiency when varying the film thickness of a layer constituting an EL element. Specifically, FIG. 5A and FIG. 5B show variation of light-extraction efficiency when varying the film thickness of the hole transport layer, in the case where no CF is used and the case where CFs are used, respectively. FIG. 5C and FIG. 5D show variation of light-extraction efficiency when varying the film thickness of the organic light-emitting layer, in the case where no CF is used and the case where CFs are used, respectively.

Comparison of FIG. 5B and FIG. 5D shows that the hole transport layer and the organic light-emitting layer are substantially equal in cycle of variation of light-extraction efficiency corresponding to the film thickness, and differ in variation width of the light-extraction efficiency, specifically, have a variation width h1 and a variation width h2, respectively. In other words, the organic light-emitting layer is smaller in ratio of variation of light-extraction efficiency to variation of film thickness than the hole transport layer.

In the case where the inkjet method is used for forming each layer constituting the organic EL element, the film thickness of the layer is adjusted by adjusting the number of drops of ink. Since the amount of one drop of ink is the minimum unit for adjustment of film thickness, the film thickness adjustment needs to be made not continuously but discretely. In this case, film thickness adjustment should be made on a layer having a smaller ratio of variation of light-extraction efficiency to variation of film thickness. This is advantageous for exact adjustment on the layer so as to have a film thickness corresponding to the highest light-extraction efficiency.

In Example 1, film thickness adjustment for each of the R, G, and B colors is mainly made on the organic light-emitting layer. This makes it easy to exactly adjust the layer so as to have a film thickness corresponding to the highest light-extraction efficiency.

FIG. 6A and FIG. 6B show light-extraction efficiency and so on when each layer constituting an organic EL element is set to have an optimal film thickness in Example 1 and Comparative example 1, respectively.

In Example 1 as described above, the respective hole transport layers of the R, G, and B colors have an optimal film thickness of 50 nm, an optimal film thickness of 50 nm, and an optimal film thickness of 20 nm, respectively. Also, respective organic light-emitting layers of the R, G, and B colors have an optimal film thickness of 100 nm, an optimal film thickness of 80 nm, and an optimal film thickness of 30 nm, respectively. Here, the respective organic EL elements of the R, G, and B colors exhibit a light-extraction efficiency of 1.8 cd/A, a light-extraction efficiency of 4.6 cd/A, and a light-extraction efficiency of 0.40 cd/A, respectively. Also, the respective organic EL elements of the R, G, and B colors exhibit a chromaticity of (0.66,0.34), a chromaticity of (0.28, 0.68), and a chromaticity (0.13,0.06), respectively. Furthermore, respective tolerable limits of difference in film thickness of the first functional layers of the R, G, and B colors are a range of −10 nm to +10 nm, a range of −10 nm to +10 nm, and a range of −15 nm to +9 nm, respectively. Tolerable margin widths of the first functional layers of the R, G, and B colors are 20 nm, 20 nm, and 24 nm, respectively.

The "tolerable limits of difference in film thickness" indicate the tolerable limits of difference in film thickness of each layer from the optimal value under the conditions that allowable ranges shown in FIG. 7 are satisfied. FIG. 7 shows the following allowable ranges of:

(1) 20% or lower variation of light-extraction efficiency at a surface of the organic EL panel;

(2) variation of chromaticity of x of 0.04 or less and y of 0.04 or less at the surface of the organic EL panel;

(3) a brightness of 90% or higher at a viewing angle of 30° with respect to a brightness at a viewing angle of 0° and a brightness of 80% or higher at a viewing angle of 45° with respect to a brightness at a viewing angle of 0°; and (4) difference in chromaticity of x of 0.04 or less and y of 0.04 or less between a viewing angle of 50° and a viewing angle of 0°.

Broader tolerable limits of difference in film thickness make it easier to adjust the film thickness on each layer during the manufacturing process. The "tolerable margin width" indicates a difference between the upper limit and the lower limit in the tolerable limits of difference in film thickness (for example, each layer of the R color in Example 1 has a tolerable margin width of 20 which is the difference between the upper limit of +10 and the lower limit of −10).

In Comparative example 1 compared with Example 1, the respective transparent conductive layers of the R, G, and B colors have an optimal film thickness of 140 nm, an optimal film thickness of 120 nm, and an optimal film thickness of 90 nm, respectively. Here, the respective organic EL elements of the R, G, and B colors exhibit a light-extraction efficiency of 1.8 cd/A, a light-extraction efficiency of 4.4 cd/A, and a light-extraction efficiency of 0.40 cd/A, respectively. Also, the respective organic EL elements of the R, G, and B colors exhibit a chromaticity of (0.66,0.34), a chromaticity of (0.28, 0.68), and a chromaticity (0.13,0.06), respectively. Furthermore, respective tolerable limits of difference in film thickness of the first functional layers of the R, G, and B colors are a range of −10 nm to +10 nm, a range of −6 nm to +15 nm, and a range of −15 nm to +9 nm, respectively. Tolerable margin widths of the first functional layers of the R, G, and B colors are 20 nm, 21 nm, and 24 nm, respectively.

According to Example 1 as described above, film thickness adjustment is made on the organic light-emitting layer, which originally needs to be formed separately for each of the R, G, and B colors, and also film thickness adjustment is made on the hole transport layer, which is easily formed by the printing method typified by the inkjet method. This exhibits the light-extraction efficiency and the chromaticity that are at the same level as those exhibited in Comparative example 1. As a result, it is possible to realize both the increase in light-extraction efficiency and the simplification of the manufacturing process.

Also in more detail, each layer constituting the organic EL element should have a film thickness within a range of ±10% of a film thickness obtained through the simulations in view of manufacturing errors. FIG. 8A to FIG. 8C each show the minimum value, the average value, and the maximum value of the film thickness of each layer constituting the organic EL element in Example 1, with respect to the R, G, and B colors, respectively. Specifically, the respective transparent conductive layers of the R, G, and B colors each should have a film thickness of 90 nm to 110 nm. The respective hole injection layers of the R, G, and B colors each should have a film thickness of 36 nm to 44 nm. The respective electron transport layers of the R, G, and B colors each should have a film thickness of 27 nm to 33 nm. Here, the respective organic light-emitting layers of the R and G colors each have an optical distance of 331 nm to 404 nm from the reflective electrode of a corresponding color, and the organic light-emitting layer of the B color has an optical distance of 285 nm to 348 nm from the reflective electrode of a corresponding color. The respective organic light-emitting layers of the R, G, and B colors each have an optical distance of 48.6 nm to 59.4 nm from the transparent electrode. Also, the respective hole transport layers of the R and G colors should have a film thickness of 45 nm to 55 nm, the hole transport layer of the B color should have a film thickness of 18 nm to 22 nm. The respective organic light-emitting layers of the R, G, and B colors should have a film thickness of 90 nm to 110 nm, a film thickness of 72 nm to 88 nm, and a film thickness of 27 nm to 33 nm, respectively.

[Specific Examples of Each Layer]

<Substrate>

The substrate 1 is a Thin Film Transistor (TFT) substrate, for example. The substrate 1 is a glass plate or quartz plate of soda glass, nonfluorescent glass, phosphate glass, borate glass, or the like; a plastic plate or plastic film of acrylic resin, styrenic resin, polycarbonate resin, epoxy resin, polyethylene, polyester, silicone resin, or the like; or a metal plate or metal foil of alumina or the like.

<Banks>

The banks 12 should be formed from an insulating material, and it is preferable that the banks 12 have organic solvent resistance. Furthermore, since the banks 12 undergo etching, baking, and the like, it is preferable that the banks 12 be formed from a material that is highly resistant to such processes. The material for the banks 12 may be an organic material such as resin, or an inorganic material such as glass. As an organic material, acrylic resin, polyimide resin, novolac-type phenolic resin, and the like can be used. As an inorganic material, silicon dioxide ($SiO_2$), silicon nitride ($Si_3N_4$), and the like can be used.

<Reflective Electrode>

The reflective electrode 2 is electrically connected to the TFT provided on the substrate 1. In addition to functioning as a positive terminal of the organic EL element, the reflective electrode 2 has the function of reflecting light emitted from the organic light-emitting layers 6b, 6g, and 6r towards the reflective electrode 2. The reflecting function may be achieved by the structural material of the reflective electrode 2 or by applying a reflective coating to the surface portion of the reflective electrode 2. For example, the reflective electrode 2 is formed from Ag (silver), APC (alloy of silver, palladium, and copper), ARA (alloy of silver, rubidium, and gold), MoCr (alloy of molybdenum and chromium), NiCr (alloy of nickel and chromium), or the like.

<Transparent Conductive Layer>

The transparent conductive layer 3 functions as a protective layer to prevent the reflective electrode 2 from naturally oxidizing during the manufacturing process. The material for the transparent conductive layer 3 should be formed from a conductive material sufficiently translucent with respect to light emitted by the organic light-emitting layers 6b, 6g, and 6r. For example, the transparent conductive layer 3 is preferably formed from ITO or IZO, which achieve good conductivity even when a film thereof is formed at room temperature.

<Hole Injection Layer>

The hole injection layer 4 has the function of injecting holes into the organic light-emitting layers 6b, 6g, and 6r. The hole injection layer 4 is formed from an oxide of a transition metal, such as tungsten oxide (WOx), molybdenum oxide (MoOx), and molybdenum tungsten oxide (MoxWyOz). Forming the hole injection layer 4 from an oxide of a transition metal allows for improvement of voltage-current density characteristics, and for an increase in emission intensity by increasing current density. Note that other metal compounds, such as a transition metal nitride, may also be used.

<Hole Transport Layer>

Examples of the material for the hole transport layer 5 include a triazole derivative, an oxadiazole derivative, an imidazole derivative, a polyarylalkane derivative, a pyrazoline derivative and pyrazolone derivative, a phenylenediamine derivative, an arylamine derivative, an amino-substituted chalcone derivative, an oxazole derivative, a styrylanthracene derivative, a fluorenone derivative, a hydrazone derivative, a stilbene derivative, a porphyrin compound, an aromatic tertiary amine compound and styrylamine compound, a butadiene compound, a polystyrene derivative, a hydrazone derivative, a triphenylmethane derivative, or a tetraphenylbenzene derivative, as disclosed in Japanese Patent Application Publication No. 5-163488. In particular, a porphyrin compound, as well as an aromatic tertiary amine compound and styrylamine compound, are preferable.

<Organic Light-Emitting Layer>

The organic light-emitting layers 6b, 6g, and 6r are formed from a fluorescent material such as, for example, an oxinoid compound, perylene compound, coumarin compound, azacoumarin compound, oxazole compound, oxadiazole compound, perinone compound, pyrrolo-pyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, anthracene compound, cyanine compound, acridine compound, metal complex of a 8-hydroxyquinoline compound, metal complex of a 2-bipyridine compound, complex of a Schiff base and a group three metal, metal complex of oxine, rare earth metal complex, and the like, as recited in Japanese Patent Application Publication No. H5-163488.

<Electron Transport Layer>

Examples of the material for the electron transport layer 7 include a nitro-substituted fluorenone derivative, a thiopyran dioxide derivative, a diphenylquinone derivative, a perylene tetracarboxyl derivative, an anthraquinodimethane derivative, a fluoronylidene methane derivative, an anthrone derivative, an oxadiazole derivative, a perinone derivative, and a quinolone complex derivative, as recited in Japanese Patent Application Publication No. H5-163488.

Note that from the perspective of further improving electron injection characteristics, the above materials for forming the electron transport layer may be doped with an alkali metal or an alkaline-earth metal, such as Na, Ba, or Ca.

<Transparent Electrode>

The transparent electrode 8 functions as a negative electrode for the organic EL element. The material for the transparent electrode 8 should be formed from a conductive material sufficiently translucent with respect to light emitted by the organic light-emitting layers 6b, 6g, and 6r. For example, the transparent electrode 8 is preferably formed from ITO or IZO.

<Thin-Film Passivation Layer>

The thin-film passivation layer 9 has the function of preventing the layers interposed between the substrate 1 and the thin-film passivation layer 9 from being exposed to moisture or air. The material for the thin-film passivation layer 9 is, for example, silicon nitride (SiN), silicon oxynitride (SiON), resin, or the like.

<Resin Passivation Layer>

The resin passivation layer 10 has the functions of adhering a back panel, which is composed of the layers from the substrate 1 to the thin-film passivation layer 9, to the substrate 11, on which are formed the color filters 13b, 13g, and 13r, and of preventing the layers from being exposed to moisture or air. The material for the resin passivation layer 10 is, for example, a resin adhesive or the like.

<Color Filters>

The color filters 13b, 13g, and 13r have the function of correcting the chromaticity of light emitted by the organic light-emitting layers.

[Organic Display Device]

Figure 9:
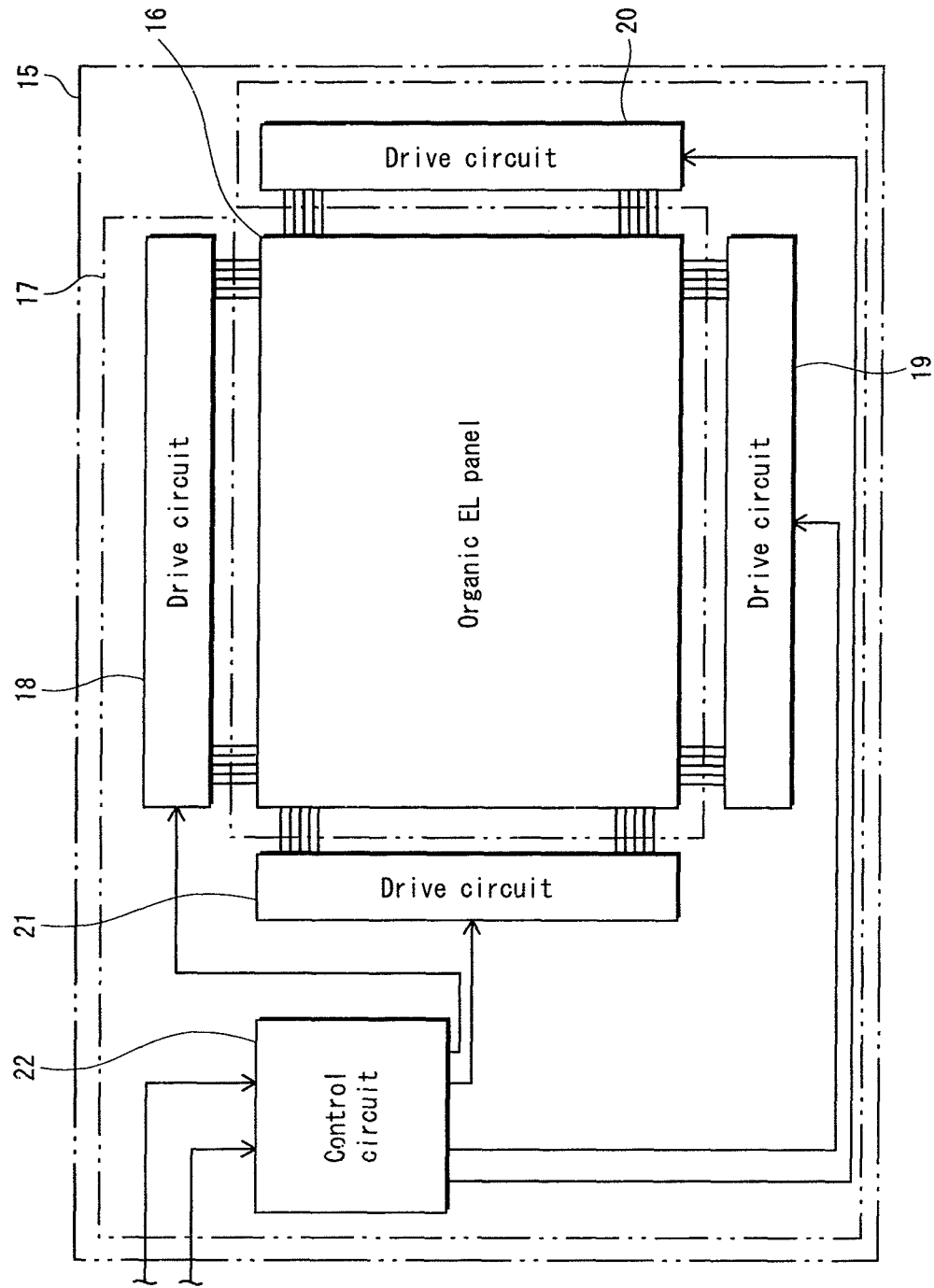
FIG. 9 is a functional block showing an organic display device according to the embodiment of the present invention.
Figure 10:
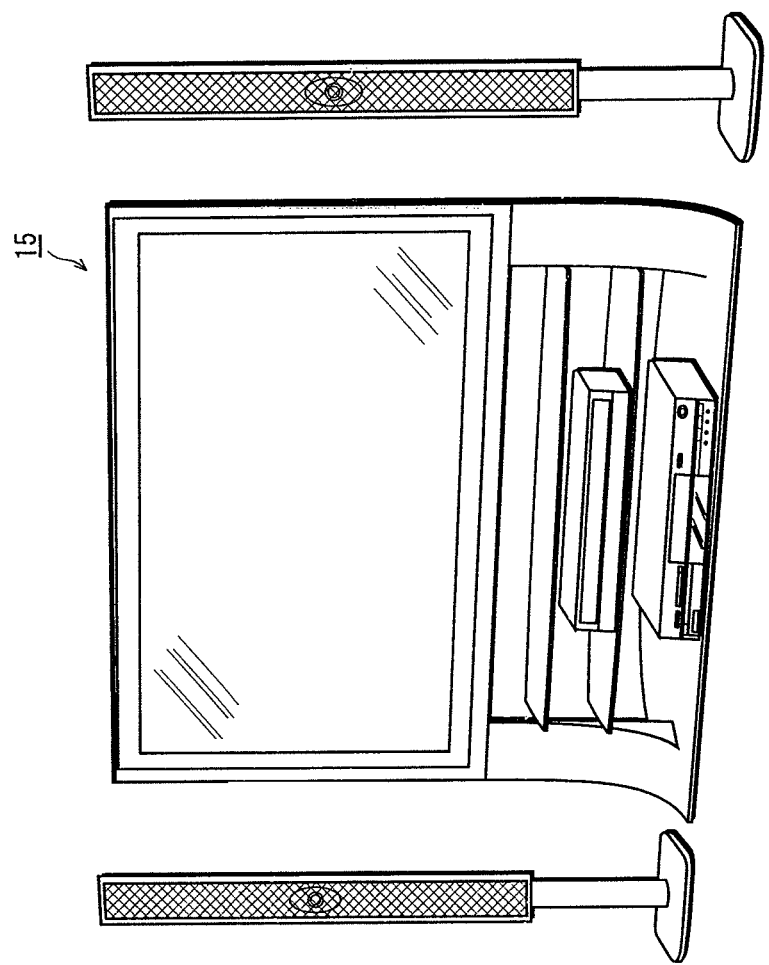
FIG. 10 is an exemplary external diagram showing the organic display device according to the embodiment of the present invention.

FIG. 9 is a functional block showing an organic display device according to the embodiment of the present invention. FIG. 10 is an exemplary external diagram showing the organic display device according to the embodiment of the present invention. An organic display device 15 includes an organic display panel 16 and a drive control unit 17 that are electrically connected to each other. The organic display panel 16 has the pixel structure shown in FIG. 1. The drive control unit 17 includes drive circuits 18 to 21 that apply voltage between the reflective electrode 2 corresponding to each organic EL element and a transparent electrode 8, and a control circuit 22 that controls operations of the drive circuits 18 to 21.

[Method of Manufacturing Organic EL Panel]

Next, the method of manufacturing an organic EL panel is described. FIG. 11A to FIG. 11D and FIG. 12A to FIG. 12C show a method of manufacturing an organic EL panel according to the embodiment of the present invention.

Figure 11A:
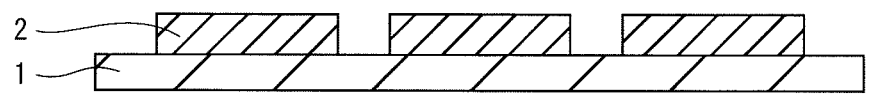
FIG. 11A to FIG. 11D show a method of manufacturing the organic EL panel according to the embodiment of the present invention.
Figure 11B:
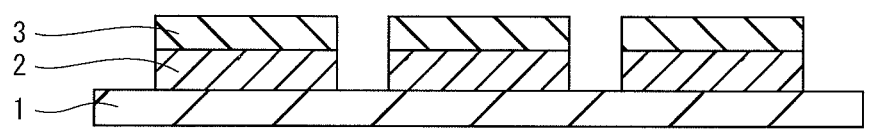

First, reflective electrodes 2 are formed on a substrate 1 by a vapor deposition method, a sputtering method, or the like (FIG. 11A). Next, transparent conductive layers 3 are formed on the respective reflective electrodes 2 by the vapor deposition method, the sputtering method, or the like (FIG. 11B). The respective transparent conductive layers 3 of the R, G, and B colors are set to have the same film thickness.

Figure 11C:
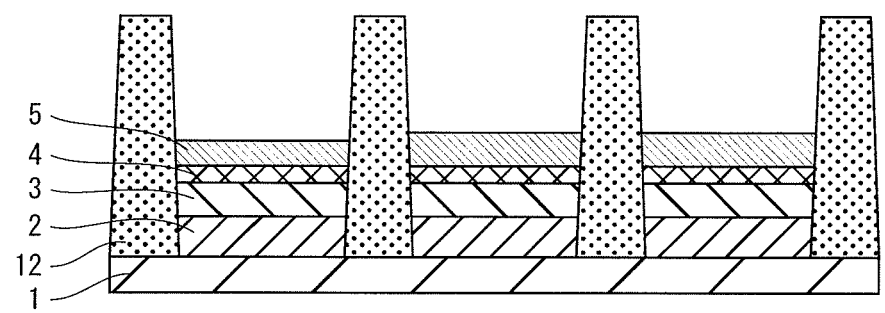

Next, on each of the transparent conductive layers 3, a hole injection layer 4, for example, is formed by a physical vapor deposition method such as the vapor deposition method and the sputtering method. Then, banks 12 are formed. Furthermore, on each of the hole injection layers 4, a hole transport layer 5, for example, is formed by a printing method such as the inkjet method (FIG. 11C). The respective hole injection layers 4 of the R, G, and B colors are set to have the same film thickness. Also, the respective hole transport layers 5 of the R and G colors are set to have the same film thickness, and to have a different film thickness from the hole transport layer 5 of the B color.

Figure 11D:
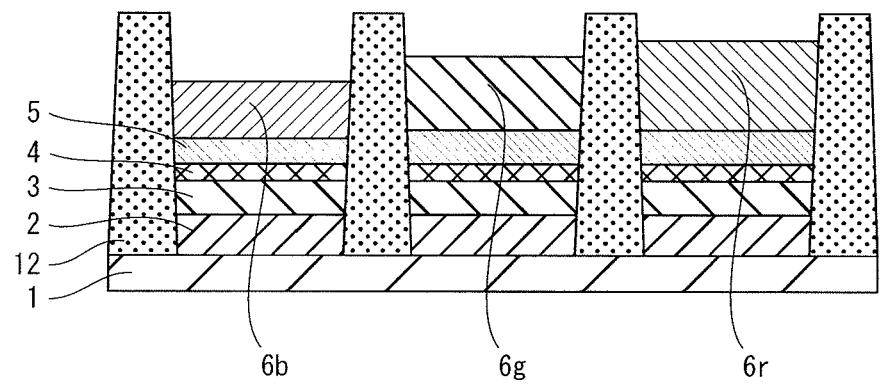

Next, on the respective hole transport layers 5, light-emitting layers 6b, 6g, and 6r, for example, are formed by a printing method such as the inkjet method (FIG. 11D). The respective organic light-emitting layers 6b, 6g, and 6r are set to appropriately have a different film thickness.

Figure 12A:
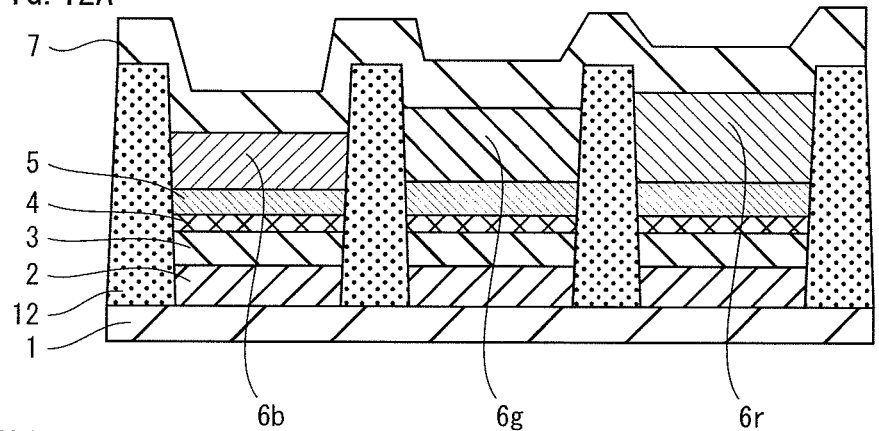
FIG. 12A to FIG. 12C show the method of manufacturing the organic EL panel according to the embodiment of the present invention.

Next, on the light-emitting layers 6b, 6g, and 6r, an electron transport layer 7 is formed by the vapor deposition method, the sputtering method, or the like (FIG. 12A). The respective electron transport layers 7 of the R, G, and B colors are set to have the same film thickness.

Figure 12B:
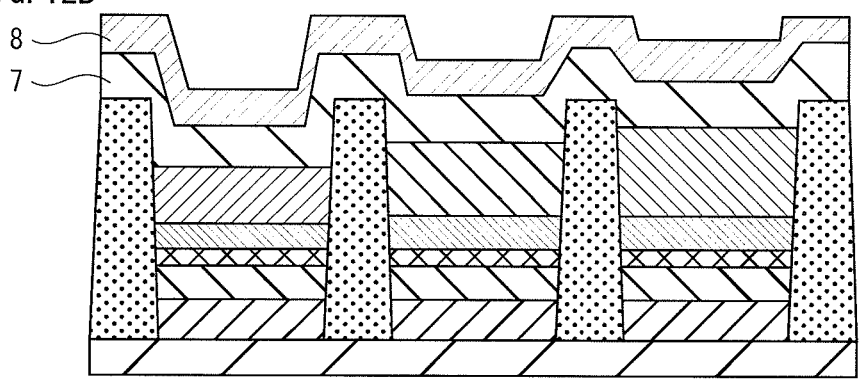

Next, on the electron transport layer 7, a transparent electrode 8 is formed by the vapor deposition method, the sputtering method, or the like (FIG. 12B). The transparent electrode 8 has a film thickness of 90 nm to 110 nm, for example.

Figure 12C:
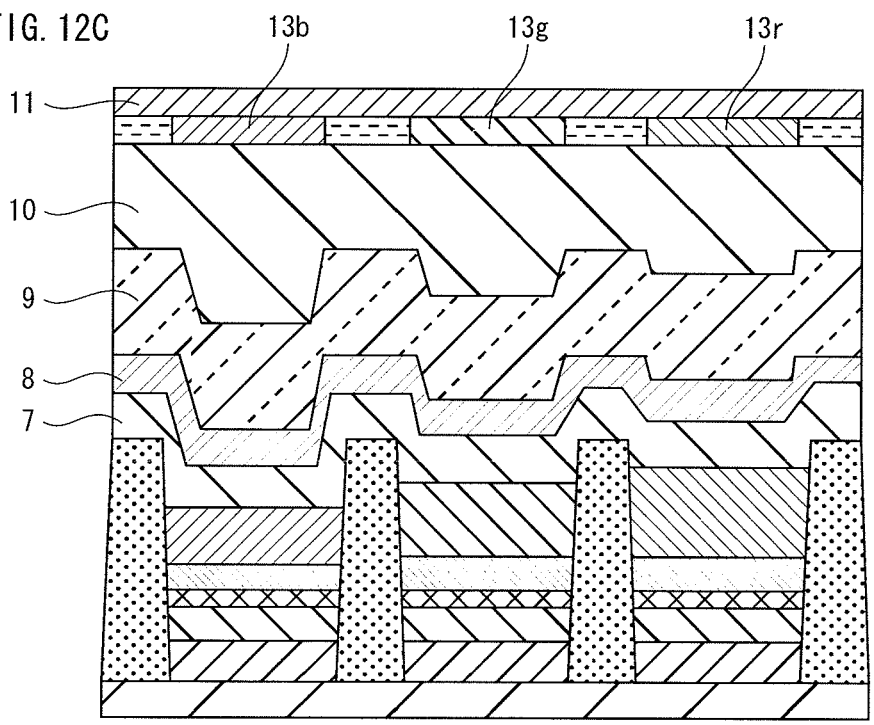

Next, a thin-film passivation layer 9 is formed on the transparent electrode 8 by the vapor deposition method, the sputtering method, or the like, and a substrate 11 in which color filters 13b, 13g, and 13r are formed is adhered thereto using a resin passivation layer 10 (FIG. 12C). These passivation layers each have a film thickness of 900 nm to 1100 nm, for example.

Although the present invention has been described based on the above embodiment, the present invention is not limited to the above embodiment. The present invention may include the following modification examples.

(1) In Example 1, the respective first functional layers of the R and G colors each have a film thickness of 171 nm to 209 nm, and the first functional layer of the B color has a film thickness of 144 nm to 176 nm. The present invention is not limited to this. It is considered that the effect of increasing the light-extraction efficiency is exhibited due to the interference phenomenon that occurs between light traveling the first optical path C1 and light traveling the second optical path C2. This leads to an idea that what is important is not the film thickness of the first functional layer, but the optical distance between the organic light-emitting layer and the reflective electrode. Therefore, the respective organic light-emitting layers of the R and G colors each should have an optical distance of 331 nm to 404 nm from the reflective electrode of a corresponding color, and the organic light-emitting layer of the B color should have an optical distance of 285 nm to 348 nm from the reflective electrode. As long as this condition is satisfied, the same effect is exhibited even if the film thickness of the first functional layer is varied.

Also, although the second functional layer has a film thickness of 27 min to 33 nm, the present invention is not limited to this similarly. The respective organic light-emitting layers of the R, G, and B colors each should have an optical distance of 48.6 nm to 59.4 nm. As long as this condition is satisfied, the same effect is exhibited even if the film thickness of the second functional layer is varied.

(2) In the above embodiment, the first functional layer is constituted from the transparent conductive layer, the hole injection layer, and the hole transport layer. Alternatively, the first functional layer may not include any one of the transparent conductive layer, the hole injection layer, and the hole transport layer. Further alternatively, the first functional layer may further include another functional layer.

(3) In the above embodiment, the second functional layer is constituted from the hole transport layer. Alternatively, the second functional layer may further include an electron injection layer, for example.

INDUSTRIAL APPLICABILITY

The present invention is applicable to organic EL displays and the like.

REFERENCE SIGNS LIST 1 substrate
2 reflective electrode
3 transparent conductive layer
4 hole injection layer
5 hole transport layer
6b, 6g, and 6r organic light-emitting layer
7 electron transport layer
8 transparent electrode
9 thin-film passivation layer
resin passivation layer
11 substrate 12 bank
13b, 13g, and 13r color filter
15 organic display device
16 organic display panel
17 drive control unit
18 to 21 drive circuit
22 control circuit

The invention claimed is:

1. An organic electro luminescence (EL) panel, comprising:
- a first electrode of each of red (R), green (G), and blue (B) colors that reflects incident light;
- a second electrode that faces the first electrode of each of the R, G, and B colors, and transmits incident light therethrough;
- an organic light-emitting layer of each of the R, G, and B colors that is disposed between the first electrode of a corresponding color and the second electrode, and emits light of a corresponding color due to voltage application between the first electrode of the corresponding color and the second electrode;
- a first functional layer of each of the R, G, and B colors that includes a charge injection/transport layer and at least one other layer, and is disposed between the first electrode of a corresponding color and the organic light-emitting layer of a corresponding color;
- a second functional layer of each of the R, G, and B colors that is disposed between the second electrode and the organic light-emitting layer of a corresponding color; and
- a color filter of each of the R, G, and B colors for chromaticity correction that is disposed opposite the organic light-emitting layer of a corresponding color with the second electrode being interposed therebetween, wherein
- a first portion of light of each of the R, G, and B colors emitted from the organic light-emitting layer of a corresponding color travels through the first functional layer of a corresponding color towards the first electrode of a corresponding color, strikes and is reflected by the first electrode of the corresponding color, and then is emitted externally after passing through the first functional layer of the corresponding color, the organic light-emitting layer of the corresponding color, the second functional layer of a corresponding color, the second electrode, and the color filter of a corresponding color,
- a second portion of the light of each of the R, G, and B colors travels through the second functional layer of the corresponding color towards the second electrode instead of towards the first electrode of the corresponding color, and is emitted externally after passing through the second electrode and the color filter of the corresponding color,
- the respective charge injection/transport layers of the R, G, and B colors each include a charge injection layer and a charge transport layer,
- the respective charge injection layers of the R, G, and B colors are equal in film thickness to each other,
- the respective charge transport layers of the R and G colors are equal in film thickness to each other, and differ in film thickness from the charge transport layer of the B color,
- the respective charge injection layers of the R, G, and B colors are each positioned on a corresponding one of the respective other layers of the R, G, and B colors,
- the respective charge transport layers of the R, G, and B colors are each positioned on a corresponding one of the respective charge injection layers of the R, G, and B colors,
- the respective at least one other layers of the R, G, and B colors are equal in film thickness to one another,
- the respective second functional layers of the R, G, and B colors are equal in film thickness to one another, and
- the respective organic light-emitting layers of the R, G, and B colors differ in film thickness from one another.

2. The organic EL panel of claim 1, wherein
the film thickness of the organic light-emitting layer of each of the R, G, and B colors is adjusted so as to correspond to a local maximum of light-extraction efficiency with respect to the light of the corresponding color emitted externally through the color filter of the corresponding color.

3. The organic EL panel of claim 2, wherein
a film thickness of the first functional layer of each of the R, G, and B colors is adjusted so as to correspond to a second local maximum of the light-extraction efficiency with respect to the light of the corresponding color emitted externally through the color filter of the corresponding color.

4. The organic EL panel of claim 1, wherein
the first functional layer of each of the R, G, and B colors includes, as the at least one other layer, a transparent conductive layer.

5. The organic EL panel of claim 1, wherein
the first functional layer of each of the R, G, and B colors includes a layer formed by a printing method and a layer formed by a physical vapor deposition method,
the respective layers of the R and G colors formed by the printing method are equal in film thickness to each other, and differ in film thickness from the layer of the B color formed by the printing method, and
the respective layers of the R, G, and B colors formed by the physical vapor deposition method are equal in film thickness to one another.

6. The organic EL panel of claim 1, wherein
the respective organic light-emitting layers of the R, G, and B colors have a film thickness of 90 nm to 110 nm, a film thickness of 72 nm to 88 nm, and a film thickness of 27 nm to 33 nm, respectively,
the first functional layer of each of the R, G, and B colors includes, as the at least one other layer, a transparent conductive layer formed on an anode that is the first electrode of the corresponding color,
the first functional layer of each of the R, G, and B colors includes, as the charge injection/transport layer, a hole injection layer formed on the transparent conductive layer and a hole transport layer formed on the hole injection layer,
the respective transparent conductive layers of the R, G, and B colors each have a film thickness of 90 nm to 110 nm,
the respective hole injection layers of the R, G, and B colors each have a film thickness of 36 nm to 44 nm, and
the respective hole transport layers of the R and G colors each have a film thickness of 45 nm to 55 nm, and the hole transport layer of the B color has a film thickness of 18 nm to 22 nm.

7. The organic EL panel of claim 6, wherein
the first electrode of each of the R, G, and B colors is formed from aluminum or alloy of aluminum, and
the transparent conductive layer of each of the R, G, and B colors is formed from Indium Zinc Oxide.

8. The organic EL panel of claim 7, wherein the respective second functional layers of the R, G, and B colors each have a film thickness of 27 nm to 33 nm.

9. The organic EL panel of claim 8, wherein the second functional layer of each of the R, G, and B colors includes an electron transport layer having a film thickness of 27 nm to 33 nm.

10. The organic EL panel of claim 1, wherein the organic light-emitting layer of each of the R, G, and B colors contains an organic material, and is formed by a printing method.

11. The organic EL panel of claim 1, wherein
the first functional layer of each of the R, G, and B colors includes, as the at least one other layer, a transparent conductive layer formed on an anode that is the first electrode of the corresponding color,
the first functional layer of each of the R, G, and B colors includes, as the charge injection/transport layer, a hole injection layer formed on the transparent conductive layer and a hole transport layer formed on the hole injection layer,
the transparent conductive layer of each of the R, G, and B colors and the hole injection layer of each of the R, G, and B colors are formed by a physical vapor deposition method, and
the hole transport layer of each of the R, G, and B colors is formed by a printing method.

12. A display device with use of the organic EL panel of claim 1.

13. A method of manufacturing an organic electro luminescence (EL) panel, comprising:
a preparing a first electrode of each of red (R), green (G), and blue (B) colors that reflects incident light;
a of disposing a first functional layer of each of the R, G, and B colors including a charge injection/transport layer and at least one other layer on the first electrode of a corresponding color;
disposing an organic light-emitting layer that emits light of each of the R, G, and B colors on the first functional layer of a corresponding color;
disposing a second functional layer of each of the R, G, and B colors on the organic light-emitting layer of a corresponding color;
disposing a second electrode that transmits incident light therethrough on the respective second functional layers of the R, G, and B colors so as to face the respective first electrodes of the R, G, and B colors; and
disposing a color filter of each of the R, G, and B colors for chromaticity correction so as to be opposite the organic light-emitting layer of a corresponding color with the second electrode being interposed therebetween, wherein
the respective charge injection/transport layers of the R, G, and B colors each include a charge injection layer and a charge transport layer,
the respective charge injection layers of the R, G, and B colors are equal in film thickness to each other,
the respective charge transport layers of the R and G colors are equal in film thickness to each other, and differ in film thickness from the charge transport layer of the B color,
the respective charge injection layers of the R, G, and B colors are each positioned on a corresponding one of the respective other layers of the R, G, and B colors,
the respective charge transport layers of the R, G, and B colors are each positioned on a corresponding one of the respective charge injection layers of the R, G, and B colors,
the respective at least one other layers of the R, G, and B colors are equal in film thickness to one another,
the respective organic light-emitting layers of the R, G, and B colors differ in film thickness from one another, and
the respective second functional layers of the R, G, and B colors are equal in film thickness to one another.

14. An organic electro luminescence (EL) panel, comprising:
a first electrode of each of red (R), green (G), and blue (B) colors that reflects incident light;
a second electrode that faces the first electrode of each of the R, G, and B colors, and transmits incident light therethrough;
an organic light-emitting layer of each of the R, G, and B colors that is disposed between the first electrode of a corresponding color and the second electrode, and emits light of a corresponding color due to voltage application between the first electrode of the corresponding color and the second electrode;
a first functional layer of each of the R, G, and B colors that includes a charge injection/transport layer and at least one other layer, and is disposed between the first electrode of a corresponding color and the organic light-emitting layer of a corresponding color;
a second functional layer of each of the R, G, and B colors that is disposed between the second electrode and the organic light-emitting layer of a corresponding color; and
a color filter of each of the R, G, and B colors for chromaticity correction that is disposed opposite the organic light-emitting layer of a corresponding color with the second electrode being interposed therebetween, wherein
a first portion of light of each of the R, G, and B colors emitted from the organic light-emitting layer of a corresponding color travels through the first functional layer of a corresponding color towards the first electrode of a corresponding color, strikes and is reflected by the first electrode of the corresponding color, and then is emitted externally after passing through the first functional layer of the corresponding color, the organic light-emitting layer of the corresponding color, the second functional layer of a corresponding color, the second electrode, and the color filter of a corresponding color,
a second portion of the light of each of the R, G, and B colors travels through the second functional layer of the corresponding color towards the second electrode instead of towards the first electrode of the corresponding color, and is emitted externally after passing through the second electrode and the color filter of the corresponding color,
the respective charge injection/transport layers of the R and G colors are equal in film thickness to each other, and differ in film thickness from the charge injection/transport layer of the B color,
the respective at least one other layers of the R, G, and B colors are equal in film thickness to one another,
the respective second functional layers of the R, G, and B colors are equal in film thickness to one another,
the respective organic light-emitting layers of the R, G, and B colors differ in film thickness from one another, and
the film thickness of the organic light-emitting layer of each of the R, G, and B colors is adjusted so as to correspond to a local maximum of light-extraction efficiency with respect to the light of the corresponding color emitted externally through the color filter of the corresponding color.

15. An organic electro luminescence (EL) panel, comprising:
- a first electrode of each of red (R), green (G), and blue (B) colors that reflects incident light;
- a second electrode that faces the first electrode of each of the R, G, and B colors, and transmits incident light therethrough;
- an organic light-emitting layer of each of the R, G, and B colors that is disposed between the first electrode of a corresponding color and the second electrode, and emits light of a corresponding color due to voltage application between the first electrode of the corresponding color and the second electrode;
- a first functional layer of each of the R, G, and B colors that includes a charge injection/transport layer and at least one other layer, and is disposed between the first electrode of a corresponding color and the organic light-emitting layer of a corresponding color;
- a second functional layer of each of the R, G, and B colors that is disposed between the second electrode and the organic light-emitting layer of a corresponding color; and
- a color filter of each of the R, G, and B colors for chromaticity correction that is disposed opposite the organic light-emitting layer of a corresponding color with the second electrode being interposed therebetween, wherein
- a first portion of light of each of the R, G, and B colors emitted from the organic light-emitting layer of a corresponding color travels through the first functional layer of a corresponding color towards the first electrode of a corresponding color, strikes and is reflected by the first electrode of the corresponding color, and then is emitted externally after passing through the first functional layer of the corresponding color, the organic light-emitting layer of the corresponding color, the second functional layer of a corresponding color, the second electrode, and the color filter of a corresponding color,
- a second portion of the light of each of the R, G, and B colors travels through the second functional layer of the corresponding color towards the second electrode instead of towards the first electrode of the corresponding color, and is emitted externally after passing through the second electrode and the color filter of the corresponding color,
- the respective charge injection/transport layers of the R and G colors are equal in film thickness to each other, and differ in film thickness from the charge injection/transport layer of the B color,
- the respective at least one other layers of the R, G, and B colors are equal in film thickness to one another,
- the respective second functional layers of the R, G, and B colors are equal in film thickness to one another,
- the respective organic light-emitting layers of the R, G, and B colors differ in film thickness from one another, and
- a film thickness of the first functional layer of each of the R, G, and B colors is adjusted so as to correspond to a second local maximum of the light-extraction efficiency with respect to the light of the corresponding color emitted externally through the color filter of the corresponding color.

* * * * *